United States Patent [19]
Nasuno et al.

[11] Patent Number: 5,990,736
[45] Date of Patent: Nov. 23, 1999

[54] HIGH FREQUENCY AMPLIFIER WITH A GUARD CIRCUIT AND A RADIO WAVE TRANSMISSION APPARATUS INCLUDING THE SAME

[75] Inventors: Isao Nasuno; Yohei Ichikawa, both of Yokohama, Japan

[73] Assignee: Matsushita Electric Industrial Co., Ltd., Osaka, Japan

[21] Appl. No.: 09/073,831

[22] Filed: May 6, 1998

[30] Foreign Application Priority Data

May 20, 1997 [JP] Japan ................................. 9-129491

[51] Int. Cl.⁶ ...................................................... H03F 3/60
[52] U.S. Cl. .............................. 330/66; 330/68; 330/286; 455/124
[58] Field of Search .................................. 330/65, 66, 67, 330/68, 286, 302, 307; 333/247; 455/124

[56] References Cited

U.S. PATENT DOCUMENTS

| | | | |
|---|---|---|---|
| 5,142,239 | 8/1992 | Brayton et al. | 330/66 |
| 5,387,888 | 2/1995 | Eda et al. | 333/247 |
| 5,768,109 | 6/1998 | Gulick et al. | 333/247 X |
| 5,886,574 | 3/1999 | Mochizuchi | 330/66 |

FOREIGN PATENT DOCUMENTS

537253  2/1993  Japan .

*Primary Examiner*—Steven J. Mottola
*Attorney, Agent, or Firm*—Pollock, Vande Sande & Amernick

[57] ABSTRACT

A high frequency power amplifier including: a multi-layer printed-circuit board, a transistor for amplifying an input signal and outputting the amplified signal, a first print circuit pattern for receiving the input signal and supplying the input signal to the transistor, a second print circuit pattern for supplying a supply voltage to the transistor, a ground terminal, and concentrated constant elements connected to the transistor on the multi-layer printed-circuit board is disclosed, wherein at least two layers of the multi-layer printed-circuit board are connected to the ground terminal, the first and second print circuit patterns are sandwiched on one layer of the multi-layer print circuit between the at least two layers, a first shielding circuit pattern, connected to the ground terminal, arranged around the first print circuit pattern on the one layer is further provided; and a second shielding circuit pattern, connected to the ground terminal, arranged around the second print circuit pattern on the one layer is further provided to provide isolation. Connection between the grounded layers or the first and second shielding circuit patterns and the ground terminal is provided with through holes or via holes. A transmission apparatus including the high frequency power amplifier is also disclosed.

25 Claims, 6 Drawing Sheets

HIGH FREQUENCY AMPLIFIER WITH A GUARD CIRCUIT AND A RADIO WAVE TRANSMISSION APPARATUS INCLUDING THE SAME

BACKGROUND OF THE INVENTION

1. Field of the Invention

This invention relates to a high frequency amplifier including a transistor on a multi-layer printed-circuit board and a shielding circuit for amplifying an input signal and a radio wave transmission apparatus including the same.

2. Description of the Prior Art

A high frequency amplifier including multi-stages of transistors on a multi-layer printed-circuit board and a guard circuit for amplifying an input signal is known. Japanese patent application provisional publication No. 5-37253 discloses such a prior art high frequency amplifier. Coupling between two consecutive stages are reduced by a ground circuit pattern or by a capacitor of which electrode is grounded.

Figure 5:
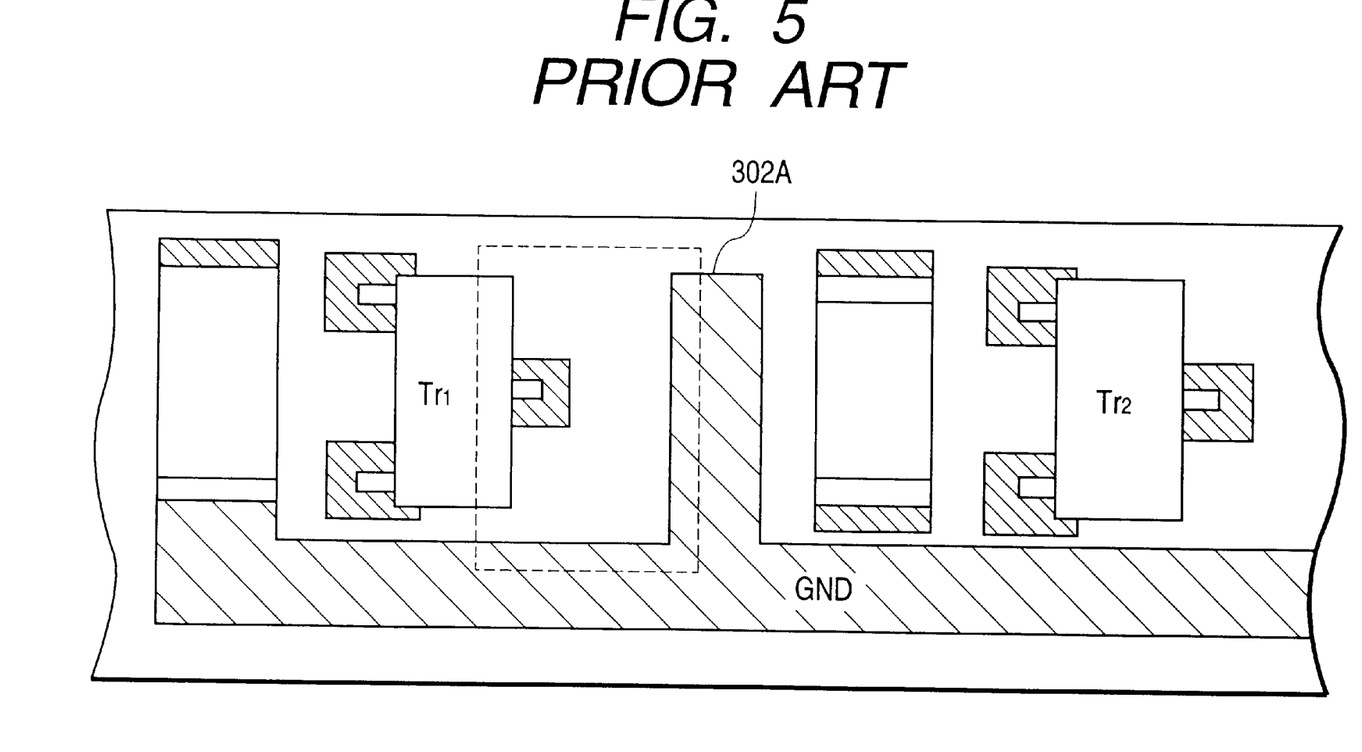
FIG. 5 is a plan view of a first prior art high frequency power amplifier.

FIG. 5 is a plan view of a first prior art high frequency power amplifier disclosed in Japanese patent application provisional publication No. 5-37253. In FIG. 5, coupling between two consecutive stages are reduced by a ground circuit pattern 302A provided therebetween.

Figure 6:
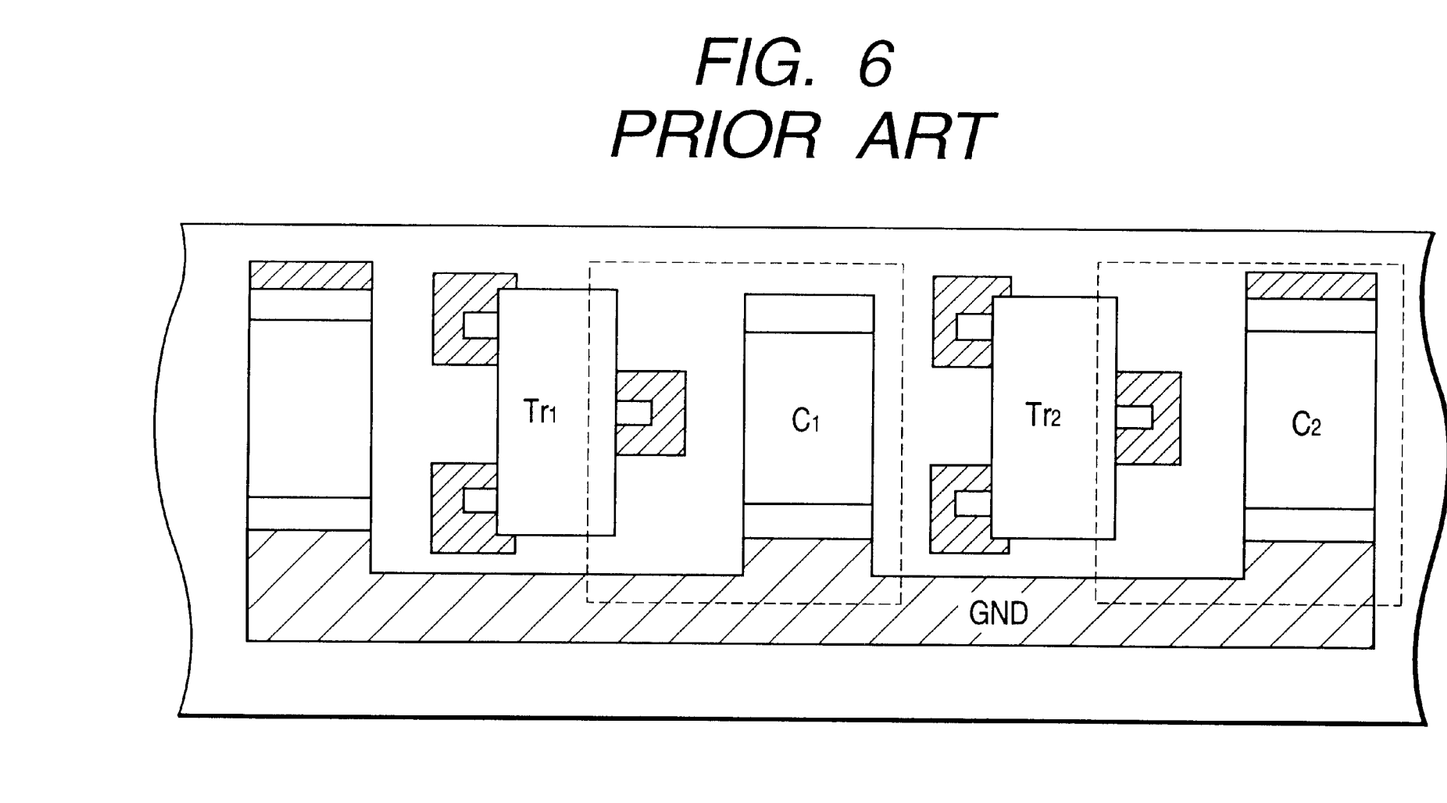
FIG. 6 is a plan view of a second prior art high frequency power amplifier.

FIG. 6 is a plan view of a second prior art high frequency power amplifier disclosed in Japanese patent application provisional publication No. 5-37253. In FIG. 6, coupling between two consecutive stages are reduced by a capacitor C1 of which one electrode is grounded.

SUMMARY OF THE INVENTION

The aim of the present invention is to provide a superior high frequency power amplifier.

According to the present invention a first high frequency power amplifier is provided which comprises: a printed-circuit board including first to $N^{th}$ layers including $i^{th}$, $k^{th}$, $j^{th}$ layers, through holes, and a ground terminal, the $i^{th}$ and $k^{th}$ layers being connected to the ground terminal using the through holes, $1<i<j<k\leq N$, the N, i, k, j being natural numbers; a transistor on the printed-circuit board for amplifying an input signal; an input matching circuit including first via holes, at least a first circuit pattern on the $j^{th}$ layer and at least a first concentrated constant element on the printed-circuit board connected to the first circuit pattern by the first via holes, for receiving and supplying the input signal to the transistor; a voltage supply circuit including second via holes, at least a second circuit pattern on the $j^{th}$ layer and at least a second concentrated constant element on the printed-circuit board connected to the second circuit pattern by the second via holes, for supplying a supply voltage to the transistor; a bias circuit for supplying a bias voltage to the transistor; an output circuit for outputting the amplified signal from the transistor; and a shielding circuit including at least a third circuit pattern connected to the ground terminal, arranged around the first circuit pattern on the $j^{th}$ layer to shield the first circuit pattern.

The first high frequency power amplifier may further comprise a second shielding circuit including at least a fourth circuit pattern connected to the ground terminal, arranged around the second circuit pattern on the $j^{th}$ layer.

In the first high frequency power amplifier, a portion of the through holes are arranged around the first via holes.

In the first high frequency power amplifier, via holes may be used instead the through holes for connecting the $i^{th}$ layer to $k^{th}$ layer.

In the first high frequency power amplifier, the printed-circuit board has a thickness and the third circuit pattern is arranged near the first circuit pattern with a distance d therebetween less than the thickness.

In the first high frequency power amplifier, assuming a thickness t between the $i^{th}$ layer and $k^{th}$ layer, the third circuit pattern is arranged near the first circuit pattern with a distance d therebetween, $d<3 \cdot t$ with effectiveness in shielding, $d<2 \cdot t$ with more effectiveness in shielding, or $d<t$ with favorable effectiveness in shielding.

In the first high frequency power amplifier, when the second shielding circuit is provided, the fourth circuit pattern is arranged near the second circuit pattern with a distance d therebetween less than the thickness of the printed-circuit board. Moreover, assuming a thickness between the $i^{th}$ layer and $k^{th}$ layer is t, the fourth circuit pattern is arranged near the second circuit pattern with a distance d therebetween, $d<3 \cdot t$ with effectiveness in shielding, $d<2 \cdot t$ with more effectiveness in shielding, or $d<t$ with favorable effectiveness in shielding.

In the first high frequency power amplifier, the third circuit pattern is arranged to surround the first circuit pattern.

According to this invention a second high frequency power amplifier is provided which comprises: a printed-circuit board including first to $N^{th}$ layers including $i^{th}$, $k^{th}$, $j^{th}$ layers, through holes, and a ground terminal, the $i^{th}$ and $k^{th}$ layers being connected to the ground terminal using the through holes, $1<i<j<k\leq N$, the N, i, k, J being natural numbers; a transistor on the printed-circuit board for amplifying an input signal; an input matching circuit including first via holes, at least a first circuit pattern on the $j^{th}$ layer and at least a first concentrated constant element on the printed-circuit board connected to the first circuit pattern by the first via holes, for receiving and supplying the input signal to the transistor; a voltage supply circuit including second via holes, at least a second circuit pattern on the $j^{th}$ layer and at least a second concentrated constant element on the printed-circuit board connected to the second circuit patten by the second via holes, for supplying a supply voltage to the transistor; a bias circuit for supplying a bias voltage to the transistor; an output circuit for outputting the amplified signal from the transistor; and a shielding circuit including at least a third circuit pattern grounded, arranged around the second circuit pattern on the $j^{th}$ layer to shield the second circuit pattern.

In the second high frequency power amplifier, a portion of the through holes are arranged around the first via holes.

In the second high frequency power amplifier, a plurality of via holes connecting the $i^{th}$ layer to $k^{th}$ layer may be used instead the through holes.

In the second high frequency power amplifier, the printed-circuit board has a thickness and the third circuit pattern is arranged near the second circuit pattern with a distance d therebetween less than the thickness.

In the second high frequency power amplifier, assuming a thickness between the $i^{th}$ layer and $k^{th}$ layer is t, the third circuit pattern is arranged near the second circuit pattern with a distance d therebetween, $d<3 \cdot t$ with effectiveness in shielding, $d<2 \cdot t$ with more effectiveness in shielding, or $d<t$ with favorable effectiveness in shielding.

According to this invention, in a third high frequency power amplifier including: a multi-layer printed-circuit board, a transistor for amplifying an input signal and outputting the amplified signal; at least a first print circuit pattern for receiving the input signal and supplying the input signal to the transistor; at least a second print circuit pattern for supplying a supply voltage to the transistor; a ground terminal; and concentrated constant elements connected to the transistor on the multi-layer printed-circuit board, at least two layers of the multi-layer printed-circuit board are connected to the ground terminal; the first and second print circuit patterns are sandwiched on one layer of the multi-layer print circuit between the at least two layers; at least a first shielding circuit pattern, connected to the ground terminal, arranged around the first print circuit pattern on the one layer is further provided; and at least a second shielding circuit pattern, connected to the ground terminal, arranged around the second print circuit pattern on the one layer is further provided.

According to this invention a radio wave transmission apparatus is provided which comprises: a modulation circuit for modulating data and outputting a modulated signal; a high frequency power amplifier comprising: a printed-circuit board including first to $N^{th}$ layers including $i^{th}$, $k^{th}$, $j^{th}$ layers, through holes and a ground terminal, the $i^{th}$ and $k^{th}$ layers being connected to the ground terminal using the through holes, $1<i<j<k\leq N$, the N, i, k, J being natural numbers; a transistor on the printed-circuit board for amplifying an input signal; an input matching circuit including first via holes, at least a first circuit pattern on the $j^{th}$ layer and at least a first concentrated constant element on the printed-circuit board connected to the first circuit pattern by the first via holes, for receiving and supplying the input signal to the transistor; a voltage supply circuit including second via holes, at least a second circuit pattern on the $j^{th}$ layer and at least a second concentrated constant element on the printed-circuit board connected to the second circuit patten by the second via holes, for supplying a supply voltage to the transistor; a bias circuit for supplying a bias voltage to the transistor; an output circuit for outputting the amplified signal from the transistor; and a first shielding circuit including at least a third circuit pattern connected to the ground terminal, arranged around the first circuit pattern on the $j^{th}$ layer to shield the first circuit pattern; a second shielding circuit having at least a fourth circuit pattern connected to the ground terminal, arranged around the second circuit pattern on the $j^{th}$ layer; and an antenna for transmitting the amplified signal from the output circuit.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinbelow will be described a first embodiment of this invention.

Figure 1:
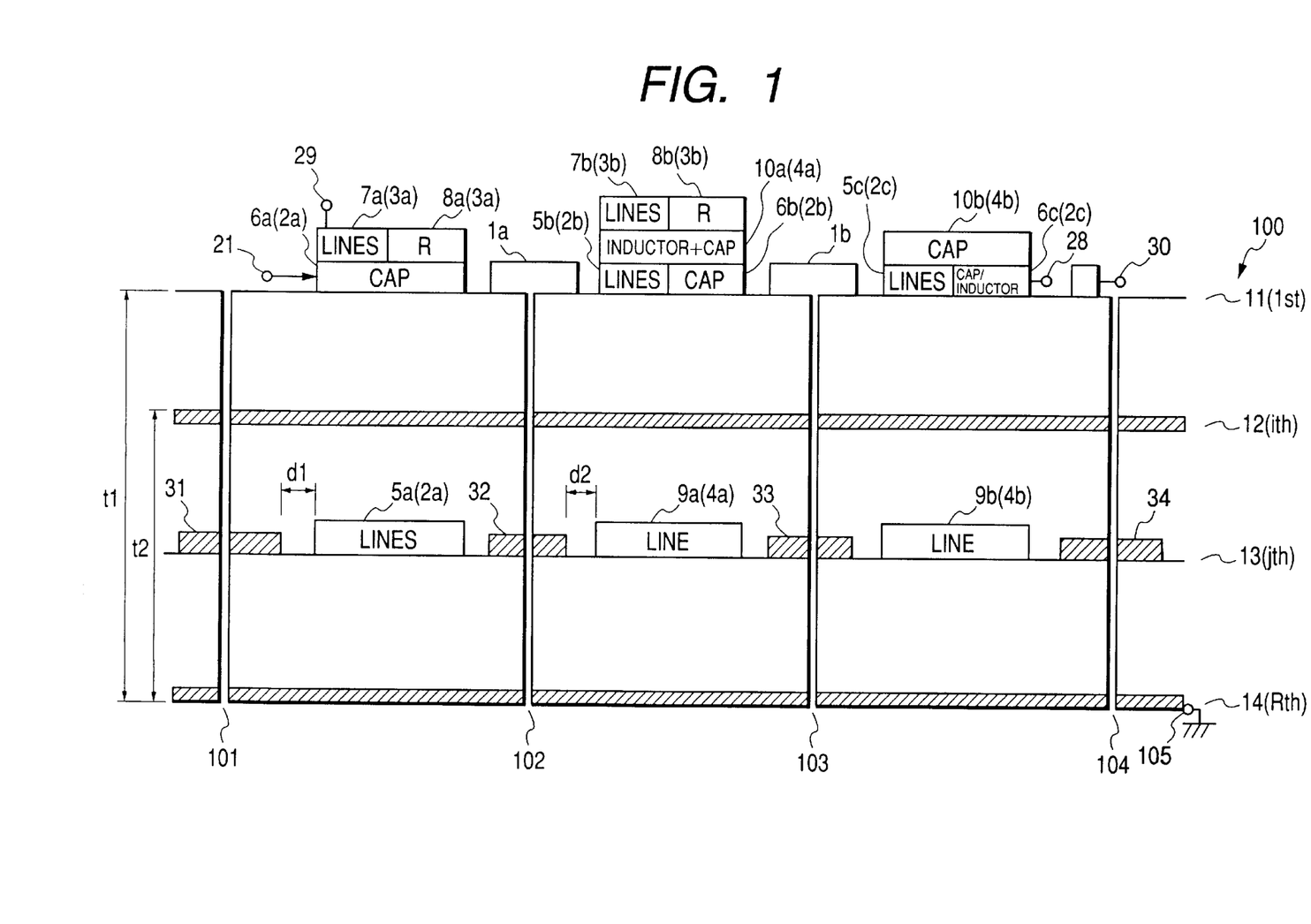
FIG. 1 is a cross-sectional side view of a high frequency amplifier of a first embodiment.
Figure 2:
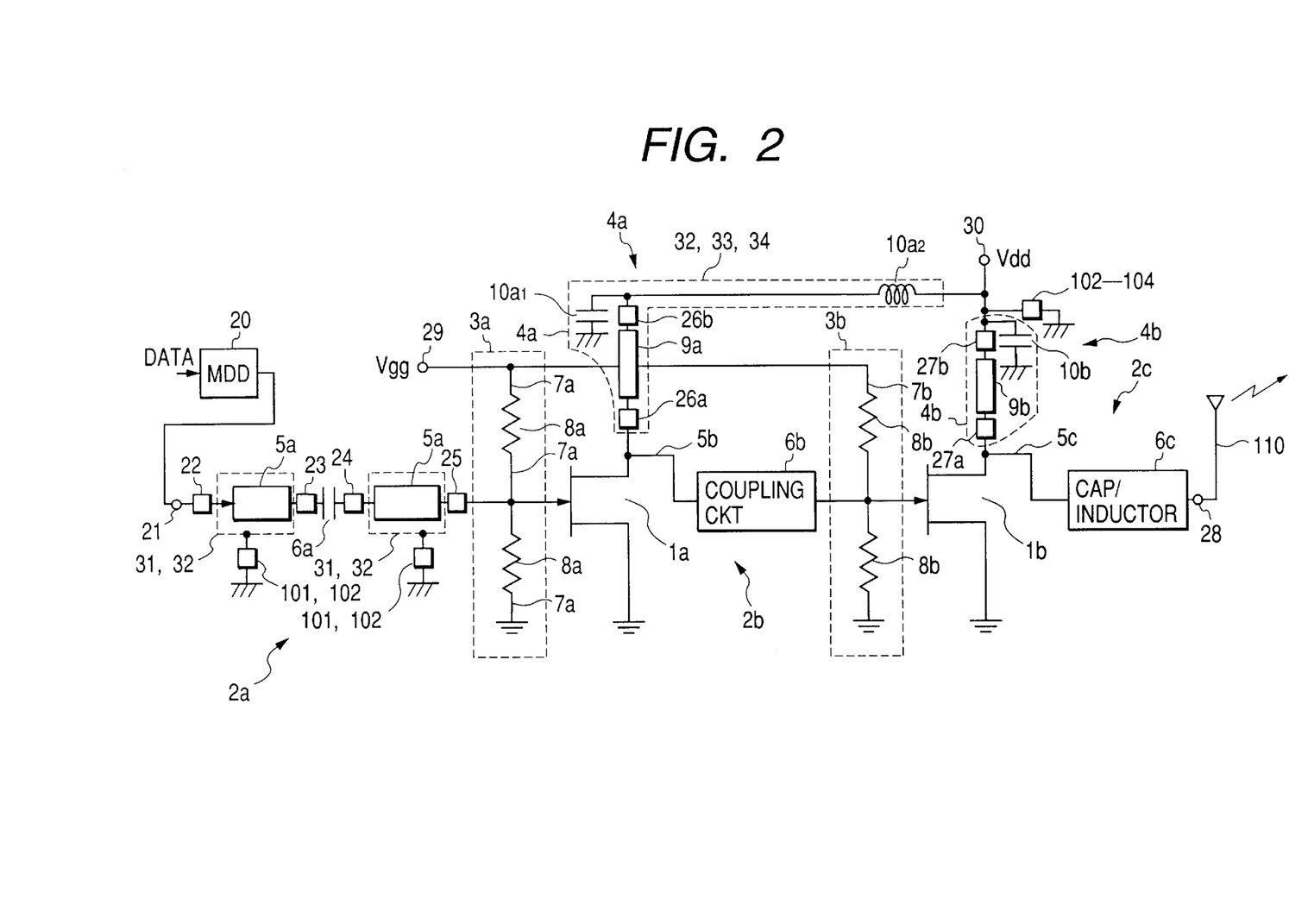
FIG. 2 is a schematic circuit diagram of the high frequency amplifier of the first embodiment.
Figure 3:
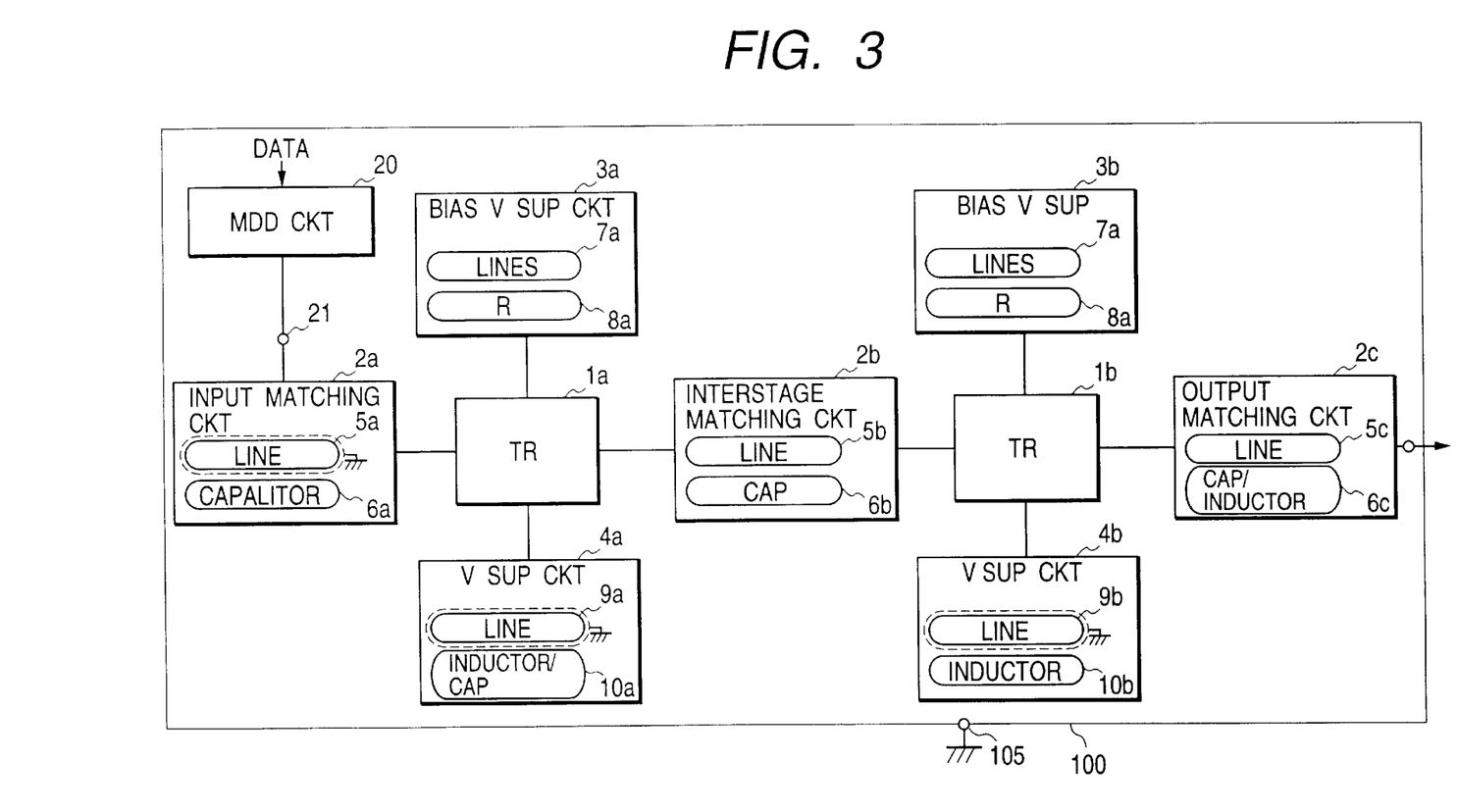
FIG. 3 is a block diagram of the high frequency amplifier of the first embodiment.

FIG. 1 is a cross-sectional side view of a high frequency amplifier of the first embodiment. FIG. 2 is a schematic circuit diagram of the high frequency amplifier of the first embodiment. FIG. 3 is a block diagram of the high frequency amplifier of the first embodiment. In FIG. 1, on a surface of a multi-layer printed-circuit board 100, blocks represented by reference 7a, 8a, 10a, 7b, 8b, 10b are vertically (upwardly in the drawing) stacked on the other blocks denoted with references 6a, 5b, 6b, 5c, and 6c. However, actually, these stacked elements are directly arranged on the multi-layer printed-circuit board 100. That is, all these elements are arranged on the first layer 11. This is because it is difficult to show all these elements on the first layer 11 in the cross-sectional view. Moreover, in FIG. 1, via holes between concentrated constant elements on the printed-circuit board 100 and circuit patterns on the intermediate layer are omitted to prevent complexity but are shown in FIG. 2.

The high frequency power amplifier of the first embodiment includes: the multi-layer printed-circuit board 100, an input matching circuit 2a, a transistor (FET) 1a, a bias voltage supply circuit 3a for supplying a bias voltage to the transistor 1a, a voltage supply circuit 4a, an interstage matching circuit 2b including a coupling circuit 6b, a bias voltage supply circuit 3b, a voltage supply circuit 4b, a transistor 1b supplied with an output from the transistor 1a through the coupling circuit 6b, a bias voltage supply from the bias voltage supply circuit 3b, a voltage supply from the voltage supply circuit 4b for outputting amplified signal through an output circuit 2c, and shielding circuits 31 to 34.

The multi-layer printed-circuit board 100 includes first to $N^{th}$ layers including $i^{th}$, $k^{th}$, $j^{th}$ layers, through holes 101–104, and a ground terminal 105. The $i^{th}$ and $k^{th}$ layers (grounded planes) are connected to the ground terminal 105 through the through holes 101–104, wherein $1<i<j<k\leq N$, and N, i, k, j are natural numbers.

The transistor 1a on the printed-circuit board 100 amplifies the input signal from the input matching circuit 2a. The input matching circuit 2a includes via holes 22–25, first circuit patterns 5a comprising microstrip lines (line) as inductors on the $j^{th}$ layer and a capacitor 6a as a first concentrated constant element on the printed-circuit board 100, which is connected to the first circuit patterns 5a by the via holes 22–25, and a terminal 21 for receiving an input signal. The input matching circuit 2a supplies the input signal to the transistor 1a with impedance matching.

The voltage supply circuit 4a includes via holes 26a and 26b, a second circuit pattern (line) 9a on the $j^{th}$ layer and a filter 10a including an inductor $10a_1$ and capacitor $10a_2$ as a second concentrated constant element on the printed-circuit board 100, connected to the second circuit patten 9a by the via holes 26a and 26b. The voltage supply circuit 4a supplies a supply voltage Vdd to the transistor 1a.

The bias circuit 3a includes third circuit patterns (lines) 7a on the printed-circuit board 100 and voltage dividing resistors 8a as third concentrated constant elements on the printed-circuit board 100 for supplying a bias voltage Vgg to the transistor 1a.

The interstage matching circuit 2b includes circuit patterns (lines) 5b on the printed-circuit board 100 and a capacitor (coupling circuit) 6b on the printed-circuit board 100 for supplying an output signal of the transistor 1a to the gate of the transistor 1b.

The voltage supply circuit 4b includes via holes 27a and 27b, a circuit pattern (line) 9b on the $j^{th}$ layer and a capacitor 10b on the printed-circuit board 100, connected to the circuit patten 9b by the via hole 27b. The voltage supply circuit 4b supplies the supply voltage Vdd to the transistor 1b through the via hole 27a.

The bias circuit 3b includes circuit patterns 7b on the printed-circuit board 100 and voltage dividing resistors 8b on the printed-circuit board 100 for supplying the bias voltage Vgg to the transistor 1b.

The output circuit 2b supplies the amplified signal from the transistor 1b to an antenna 110 to transmit a radio wave signal.

The shielding circuit patterns 31 and 32 are connected to the grounded terminal 105 through the through holes 101 and 102 and arranged around the first circuit patterns 5a on the $j^{th}$ layer to shield the first circuit pattern 5a to provide high frequency isolation.

The shielding circuit patterns 32 to 34 are connected to the ground terminal 105 through through holes 102 to 104, arranged around the circuit patterns 9a and 9b on the $j^{th}$ layer to shield the first circuit patterns 9a and 9b to provide high frequency isolation.

The through holes 101–104 pierces the printed-circuit board 100 from the first to $N^{th}$ layers.

Out of the above-mentioned elements, the transistors 1a and 1b, the capacitor 6a as the concentrated constant of the input matching circuit 2a, the interstage matching circuit 2b, the output matching circuit 2c, the bias voltage supply circuits 3a and 3b, the capacitors 10a, and 10b and the inductors $10a_2$ of the voltage supplying circuits 4a and 4b as concentrated constant elements are arranged on the first layer 11.

On the other hand, the first circuit patterns (microstrip lines) 5a, the print circuit patterns 9a and 9b are formed on the third ($j^{th}$) layer 13. The first circuit pattern 5a, the print circuit patterns 9a and 9b are shielded by the circuit pattern 31 to 34 on the third layer 13 and the grounded planes on the second and fourth layers 12 and 14.

The input signal is applied to the input terminal 21 from a modulation circuit 20 which modulates a carrier signal with data. The input signal is supplied to the transistor 1a which amplifies the input signal. The amplified signal from the transistor 1a is supplied to the gate of the transistor 1b through the interstage matching circuit 2b. The transistor 1b further amplifies the output of the transistor 1a and supplies amplified output signal to the antenna 110 through the output matching circuit 2c to transmit the radio wave signal.

A portion of or the whole of circuit patterns in the interstate matching circuit 2b and the output matching circuit 2c may be formed on the third layer 13.

On the third layer 13, the grounded circuit patterns 31 is formed on the side of the first circuit patterns 5a, the grounded circuit pattern 32 is formed between the first circuit patterns 5a and circuit patterns 9a of the voltage supply circuit 4a, the grounded circuit pattern 33 is formed between the circuit patterns 9a and 9b of the voltage supply circuits 4a and 4b, and the grounded circuit pattern 34 is formed near the circuit pattern 9b of the voltage supply circuit 4b.

Moreover, a portion of the through holes 101 to 104 are arranged around the via holes 22 to 25.

Therefore, the first circuit patterns 5a are shielded by the grounded second and fourth layers 12 and 14 and by the grounded circuit patterns 31 and 32 and the circuit patterns 9a and 9b of the voltage supply circuits 4a and 4b are shielded by the grounded second and fourth layers 12 and 14 and by the grounded circuit patterns 32 to 34.

The printed-circuit board 100 has a thickness t1 and the grounded circuit pattern 31 or 32 may be arranged near the first circuit pattern 5a with a distance d1 therebetween less than the thickness t1.

Moreover, the grounded circuit pattern 31 or 32 may be arranged near the first circuit pattern 5a with the distance d1 therebetween wherein d1<3·t2 wherein t2 is thickness between the $i^{th}$ layer and $k^{th}$ layer. Further, d1 may be less than 2·t2 with more effectiveness. Still further, d1 may be less than t2 with a favorable effectiveness.

On the other hand, the grounded circuit pattern 32 is formed near the circuit pattern 9a with a distance d2 therebetween less than the thickness t. Moreover, d2 is less than 3·t2 with effectiveness, or less than 3·t2 with more effectiveness, or less than t2 with a favorable effectiveness.

The circuit patterns 31 and 32 may be formed to surround the first circuit pattern 5a as shown in FIG. 2 or may be formed not to surround the microstrip line 5a but near the first circuit pattern 5a. Similarly, the circuit patterns 32 to 34 may be formed to surround the circuit patterns 9a and 9b as shown in FIG. 2 or may be formed not to surround the circuit patterns 9a and 9b but near the first circuit pattern 5a.

As mentioned, at least two layers 12 and 14 of the multi-layer printed-circuit board 100 are connected to the ground terminal 105. The print circuit patterns 5a and 9a are sandwiched between the layers 12 and 14 on the layer 13 therebetween. The shielding circuit pattern, connected to the ground terminal 105, arranged around the first circuit pattern 5a on the layer 13 is further provided for a higher high frequency isolation. The second shielding circuit patterns 32 to 34, connected to the ground terminal 105, arranged around the print circuit pattern 9a on the layer 13 is further provided for a higher high frequency isolation.

Figure 4:
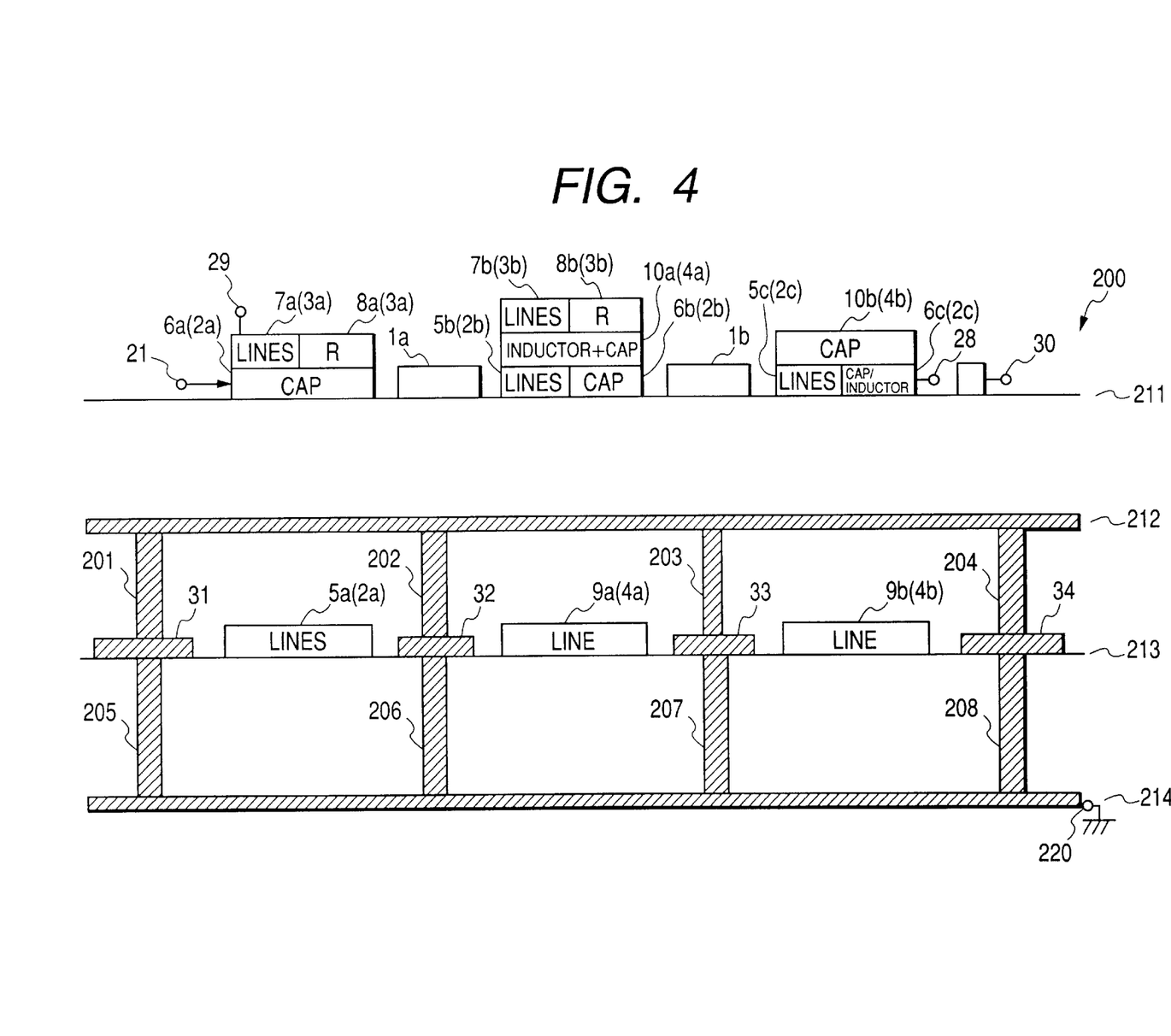
FIG. 4 is a cross-sectional side view of a high frequency amplifier of a second embodiment.

FIG. 4 is a cross-sectional side view of a high frequency amplifier of a second embodiment. In FIG. 4, as similar to FIG. 1, all elements on the first layer are directly arranged on the first layer 211.

The high frequency amplifier of the second embodiment is substantially the same as that of the first embodiment. The difference is that instead the through holes 101 to 104 via holes 201 to 208 connect the second layer 212, the fourth layer 214, and the circuit pattern 31 to 34 to the ground terminal 220. The via holes 201 to 208 do not reach the first layer 211, so that it is made easier to arrange the elements on the surface of the multi-layer circuit board 200.

What is claimed is:

1. A high frequency power amplifier comprising:
  a printed-circuit board (100) including first to $N^{th}$ layers including $i^{th}$, $k^{th}$, $j^{th}$ layers, first connection means (101–104), and a ground terminal (105), said $i^{th}$ and $k^{th}$ layers being connected to said ground terminal using said first connection means, 1<i<j<k≦N, said N, i, k, j being natural numbers;
  a transistor (1a) on said printed-circuit board for amplifying an input signal;
  an input matching circuit (2a) including second connection means (22–25), at least a first circuit pattern (5a) on said $j^{th}$ layer and at least a first concentrated constant element (6a) on said printed-circuit board connected to said first circuit pattern by said second connection means, for receiving and supplying said input signal to said transistor;

a voltage supply circuit including third connection means (26a, 26b), at least a second circuit pattern (9a) on said $j^{th}$ layer and at least a second concentrated constant element ($10a_1$, $10a_2$) on said printed-circuit board connected to said second circuit patten by said third connection means, for supplying a supply voltage to said transistor;

a bias circuit for supplying a bias voltage to said transistor;

an output circuit (2b) for outputting the amplified signal from said transistor; and a shielding circuit having fourth connection means (101–104) connected to said grounded terminal and at least a third circuit pattern (31, 32), connected to said fourth connection means, arranged around said first circuit pattern on said $j^{th}$ layer to shield said first circuit pattern.

2. The high frequency power amplifier as claimed in claim 1, further comprising a second shielding circuit having fifth connection means (102–104), and at least a fourth circuit pattern (32–34) connected to said ground terminal through said fifth connection means, arranged around said second circuit pattern on said $j^{th}$ layer.

3. The high frequency power amplifier as claimed in claim 1, wherein said first connection means comprises a plurality of through holes (101–104) piercing said printed-circuit board from said first to $N^{th}$ layers.

4. The high frequency power amplifier as claimed in claim 3, wherein said second connection means comprises via holes (22–25) and said a portion (101, 102) of said through holes are arranged around said via holes.

5. The high frequency power amplifier as claimed in claim 1, wherein said first connection means comprises a plurality of via holes connecting said $i^{th}$ layer to $k^{th}$ layer.

6. The high frequency power amplifier as claimed in claim 1, wherein said printed-circuit board has a thickness and said third circuit pattern is arranged near said first circuit pattern with a distance d therebetween less than said thickness.

7. The high frequency power amplifier as claimed in claim 1, wherein said printed-circuit board has a thickness t between said $i^{th}$ layer and $k^{th}$ layer and said third circuit pattern is arranged near said first circuit pattern with a distance d therebetween, d<3t.

8. The high frequency power amplifier as claimed in claim 7, wherein said printed-circuit board has a thickness t between said $i^{th}$ layer and $k^{th}$ layer and said third circuit pattern is arranged near said first circuit pattern with a distance d therebetween, d<2t.

9. The high frequency power amplifier as claimed in claim 8, wherein said printed-circuit board has a thickness t between said $i^{th}$ layer and $k^{th}$ layer and said third circuit pattern is arranged near said first circuit pattern with a distance d therebetween, d<t.

10. The high frequency power amplifier as claimed in claim 2, wherein said printed-circuit board has a thickness and said fourth circuit pattern is arranged near said second circuit pattern with a distance d therebetween less than said thickness.

11. The high frequency power amplifier as claimed in claim 2, wherein said printed-circuit board has a thickness t between said $i^{th}$ layer and $k^{th}$ layer and said fourth circuit pattern is arranged near said second circuit pattern with a distance d therebetween, d<3t.

12. The high frequency power amplifier as claimed in claim 11, wherein said printed-circuit board has a thickness t between said $i^{th}$ layer and $k^{th}$ layer and said fourth circuit pattern is arranged near said second circuit pattern with a distance d therebetween, d<2t.

13. The high frequency power amplifier as claimed in claim 12, wherein said printed-circuit board has a thickness t between said $i^{th}$ layer and $k^{th}$ layer and said fourth circuit pattern is arranged near said second circuit pattern with a distance d therebetween, d<t.

14. The high frequency power amplifier as claimed in claim 1, said third circuit pattern is arranged to surround said first circuit pattern.

15. A high frequency power amplifier comprising:

a printed-circuit board (100) including first to $N^{th}$ layers including $i^{th}$, $k^{th}$, $j^{th}$ layers, first connection means (101–104), and a ground terminal (105), said $i^{th}$ and $k^{th}$ layers being connected to said ground terminal using said first connection means, $1<i<j<k\leq N$, said N, i, k, j being natural numbers;

a transistor (1a) on said printed-circuit board for amplifying an input signal;

an input matching circuit (2a) including second connection means (22–25), at least a first circuit pattern (5a) on said $j^{th}$ layer and at least a first concentrated constant element (6a) on said printed-circuit board connected to said first circuit pattern by said second connection means, for receiving and supplying said input signal to said transistor;

a voltage supply circuit including third connection means (26a, 26b), at least a second circuit pattern (9a) on said $j^{th}$ layer and at least a second concentrated constant element ($10a_1$, $10b_2$) on said printed-circuit board connected to said second circuit patten by said third connection means, for supplying a supply voltage to said transistor;

a bias circuit for supplying a bias voltage to said transistor;

an output circuit (2b) for outputting the amplified signal from said transistor; and a shielding circuit having fourth connection means (101–104) connected to said grounded terminal and at least a third circuit pattern (31, 32), connected to said fourth connection means, arranged around said second circuit pattern on said $j^{th}$ layer to shield said second circuit pattern.

16. The high frequency power amplifier as claimed in claim 15, further comprising a second shielding circuit (31, 32) having fifth connection means (22–25), and at least a fourth circuit pattern (31, 32) connected to said ground terminal through said fifth connection means, arranged around said second circuit pattern on said $j^{th}$ layer.

17. The high frequency power amplifier as claimed in claim 15, wherein said first connection means comprises a plurality of through holes (101–104) piercing said printed-circuit board from said first to $N^{th}$ layers.

18. The high frequency power amplifier as claimed in claim 15, wherein said second connection means comprises via holes (22–25) and a portion (101, 102) of said through holes are arranged around said via holes.

19. The high frequency power amplifier as claimed in claim 15, wherein said first connection means comprises a plurality of via holes connecting said $i^{th}$ layer to $k^{th}$ layer.

20. The high frequency power amplifier as claimed in claim 15, wherein said printed-circuit board has a thickness and said third circuit pattern is arranged near said second circuit pattern with a distance d therebetween less than said thickness.

21. The high frequency power amplifier as claimed in claim 15, wherein said printed-circuit board has a thickness t between said $i^{th}$ layer and $k^{th}$ layer and said third circuit pattern is arranged near said second circuit pattern with a distance d therebetween, d<3t.

22. The high frequency power amplifier as claimed in claim 21, wherein said printed-circuit board has a thickness t between said $i^{th}$ layer and $k^{th}$ layer and said third circuit pattern is arranged near said second circuit pattern with a distance d therebetween, d<2t.

23. The high frequency power amplifier as claimed in claim 22, wherein said printed-circuit board has a thickness t between said $i^{th}$ layer and $k^{th}$ layer and said third circuit pattern is arranged near said second circuit pattern with a distance d therebetween, d<t.

24. A high frequency power amplifier including: a multi-layer printed-circuit board, a transistor for amplifying an input signal and outputting the amplified signal, at least a first print circuit pattern for receiving said input signal and supplying said input signal to said transistor, at least a second print circuit pattern for supplying a supply voltage to said transistor, a ground terminal and concentrated constant elements connected to said transistor on said multi-layer printed-circuit board, characterized in that (the improvement comprises):

at least two layers of said multi-layer printed-circuit board are connected to said ground terminal;

said first and second print circuit patterns are sandwiched on one layer of said multi-layer print circuit between said at least two layers;

at least a first shielding circuit pattern, connected to said ground terminal, arranged around said first print circuit pattern on said one layer is further provided; and at least a second shielding circuit pattern, connected to said ground terminal, arranged around said second print circuit pattern on said one layer is further provided.

25. A radio wave transmission apparatus comprising:

modulation means for modulating data and outputting a modulated signal;

a high frequency power amplifier comprising:

a printed-circuit board (100) including first to $N^{th}$ layers including $i^{th}$, $k^{th}$, $j^{th}$ layers, first connection means (101–104), and a ground terminal (105), said $i^{th}$ and $k^{th}$ layers being connected to said ground terminal using said first connection means, $1<i<j<k\leq N$, said N, i, k, j being natural numbers;

a transistor (1*a*) on said printed-circuit board for amplifying said modulated signal;

an input matching circuit (2*a*) including second connection means (22–25), at least a first circuit pattern (5*a*) on said $j^{th}$ layer and at least a first concentrated constant element (6*a*) on said printed-circuit board connected to said first circuit pattern by said second connection means, for receiving and supplying said modulated signal to said transistor;

a voltage supply circuit including third connection means (26*a*, 26*b*), at least a second circuit pattern (9*a*) on said $j^{th}$ layer and at least a second concentrated constant element (10*a*₁, 10*a*₂) on said printed-circuit board connected to said second circuit patten by said third connection means, for supplying a supply voltage to said transistor;

a bias circuit for supplying a bias voltage to said transistor;

an output circuit (2*b*) for outputting the amplified signal from said transistor; and a first shielding circuit having fourth connection means (101–104) connected to said grounded terminal and at least a third circuit pattern (31, 32), connected to said fourth connection means, arranged around said first circuit pattern on said $j^{th}$ layer to shield said first circuit pattern;

a second shielding circuit having fifth connection means (102–104), and at least a fourth circuit pattern (32–34) connected to said ground terminal through said fifth connection means, arranged around said second circuit pattern on said $j^{th}$ layer; and an antenna for transmitting the amplified signal from said output circuit.

* * * * *